(12) United States Patent
Ulichney

(10) Patent No.: US 11,247,401 B2
(45) Date of Patent: Feb. 15, 2022

(54) DENSITY RANK MATRIX NORMALIZATION FOR THREE-DIMENSIONAL PRINTING

(71) Applicant: Hewlett-Packard Development Company, L.P., Houston, TX (US)

(72) Inventor: Robert Ulichney, Stow, MA (US)

(73) Assignee: Hewlett-Packard Development Company, L.P., Spring, TX (US)

( * ) Notice: Subject to any disclaimer, the term of this patent is extended or adjusted under 35 U.S.C. 154(b) by 735 days.

(21) Appl. No.: 16/072,264

(22) PCT Filed: Apr. 29, 2016

(86) PCT No.: PCT/US2016/030166
§ 371 (c)(1),
(2) Date: Jul. 24, 2018

(87) PCT Pub. No.: WO2017/188999
PCT Pub. Date: Nov. 2, 2017

(65) Prior Publication Data
US 2021/0206107 A1    Jul. 8, 2021

(51) Int. Cl.
*B29C 64/393* (2017.01)
*B33Y 50/00* (2015.01)
(Continued)

(52) U.S. Cl.
CPC ........... *B29C 64/393* (2017.08); *B29C 64/00* (2017.08); *B33Y 50/00* (2014.12); *B33Y 50/02* (2014.12); *G06F 30/17* (2020.01); *G06T 17/10* (2013.01)

(58) Field of Classification Search
CPC ....... B29C 64/393; B29C 64/00; G06F 30/17; G06T 17/10; B33Y 50/00; B33Y 50/02
See application file for complete search history.

(56) References Cited

U.S. PATENT DOCUMENTS 5,028,950 A    7/1991  Fritsch
7,522,312 B2   4/2009  Inoue et al.
(Continued)

FOREIGN PATENT DOCUMENTS

CN    103978690 A    8/2014
CN    105183405      12/2015
(Continued)

OTHER PUBLICATIONS

Chllapalli ("Lattice Structures using 3D-Printing" Publish May 2015) 11 pages (Year: 2015).*
(Continued)

*Primary Examiner* — Quoc A Tran
(74) *Attorney, Agent, or Firm* — Mannava & Kang

(57) ABSTRACT

According to an example, density rank matrix normalization for three dimensional printing may include receiving a density rank matrix. The density rank matrix may include elements that include rank values, and the rank values may specify an order by which a voxel is to be turned on to generate an output object. A normalization specification of maximum and minimum structure sizes for structures that are to form the output object may be received. Further, each of the rank values may be converted, according to the normalization specification, to a corresponding threshold value to generate a density threshold matrix.

15 Claims, 16 Drawing Sheets

(51) Int. Cl.
*B33Y 50/02* (2015.01)
*B29C 64/00* (2017.01)
*G06F 30/17* (2020.01)
*G06T 17/10* (2006.01)
*G06F 17/00* (2019.01)

(56) References Cited

U.S. PATENT DOCUMENTS

| | | | |
|---|---|---|---|
| 2014/0031967 A1 | 1/2014 | Unger et al. | |
| 2014/0037873 A1* | 2/2014 | Cheung | B64C 1/06 |
| | | | 428/34.1 |
| 2014/0303942 A1 | 10/2014 | Wighton et al. | |
| 2015/0278414 A1* | 10/2015 | Zhou | G06F 30/23 |
| | | | 703/2 |
| 2015/0298153 A1* | 10/2015 | Baker | B41J 2/04588 |
| | | | 438/7 |
| 2016/0208476 A1* | 7/2016 | Wadley | C22C 38/40 |
| 2019/0210052 A1* | 7/2019 | Baker | H01L 51/56 |

FOREIGN PATENT DOCUMENTS

| | | |
|---|---|---|
| EP | 1437882 A1 | 7/2004 |
| WO | WO-2013117001 A1 | 8/2013 |
| WO | WO-2017189001 A1 | 11/2017 |

OTHER PUBLICATIONS

Cho, W. et al. "A Dithering Algorithm for Local Composition Control with Three-dimensional Printing", Aug. 2003; http://www.mit.edu/~tdp/info-flow/publications/dither_algo.pdf.

Hiller, J. et al. "Design and Analysis of Digital Materials for Physical 3D Voxel Printing"; Nov. 6, 2008.

* cited by examiner

DENSITY RANK MATRIX NORMALIZATION FOR THREE-DIMENSIONAL PRINTING

BACKGROUND

In three-dimensional (3D) printing, one technique to create an object is with successive layers of material. The successive layers of material may be applied under computer control. The object may be formed from a variety of sources. For example, the object may be formed from a 3D model. The object may be formed of virtually any geometry. Further, the object may be formed of any material, including ceramics, metals, polymers, and composites.

BRIEF DESCRIPTION OF DRAWINGS

Features of the present disclosure are illustrated by way of example and not limited in the following figure(s), in which like numerals indicate like elements, in which.

DETAILED DESCRIPTION

Figure 1:
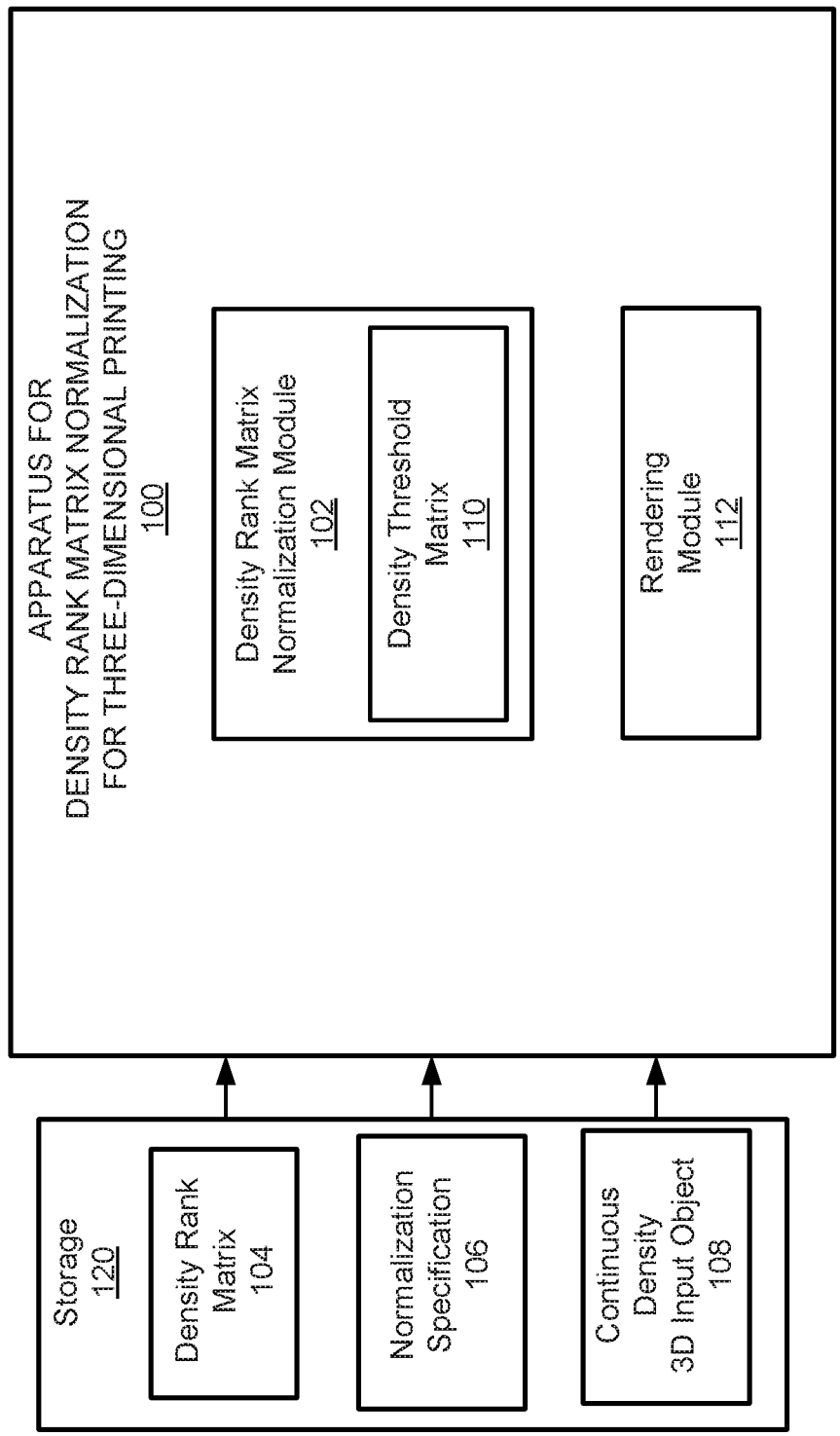
FIG. 1 illustrates an architecture of an apparatus for density rank matrix normalization for three-dimensional printing, according to an example of the present disclosure.

For simplicity and illustrative purposes, the present disclosure is described by referring mainly to examples. In the following description, numerous specific details are set forth in order to provide a thorough understanding of the present disclosure. It will be readily apparent however, that the present disclosure may be practiced without limitation to these specific details. In other instances, some methods and structures have not been described in detail so as not to unnecessarily obscure the present disclosure.

Throughout the present disclosure, the terms "a" and "an" are intended to denote at least one of a particular element. As used herein, the term "includes" means includes but not limited to, and the term "including" means including but not limited to. The term "based on" means based at least in part on.

With respect to the manufacture of 3D objects, reducing an overall amount of material used for the manufacture of a 3D object may be desirable from a weight reduction perspective. Reducing fused material in a core of an otherwise solid object may also be desirable from a thermal management perspective. However, reducing the amount of overall material used and/or reducing fused material in a core of an otherwise solid object may reduce the object's structural strength and/or the object's ability to accommodate stresses.

In order to address the aforementioned technical challenges with respect to the manufacture of 3D objects to maintain structural strength and stress accommodation properties, an apparatus for density rank matrix normalization for 3D printing and a method for density rank matrix normalization for 3D printing are disclosed herein.

For the apparatus and method disclosed herein, a density rank matrix may be received and normalized to generate a density threshold matrix. The density threshold matrix may be analyzed with respect to details of a continuous density 3D input object to generate a bistate output object. Accordingly, the density threshold matrix may be used in a 3D object manufacturing process, where the 3D object that is manufactured includes variable density, and includes a specified structural strength, specified stress accommodation properties, and other such properties.

The attribute of density may be described as solidness or its inverse sparsity. A density of a 3D object may range from 0%, which may be referred to as empty space, to 100%, which may be referred to as solid.

The density rank matrix may be described as a periodic 3D matrix of size X by Y by Z (i.e., (X, Y, Z)), where each element is an integer indicating the order that the element will turn on a voxel with increasing density. The density rank matrix may include rank values that range from 1 to n, where n represents a total number of elements of the density rank matrix. For example, for a X by Y by Z density rank matrix, the total number of elements n may include X times Y times Z elements. The density rank matrix may be referred to herein as a rectangular periodic matrix, where the density rank matrix provides a rectangular period that tiles all of three-dimensional space. The density rank matrix may provide for the rendering of a variable density 3D object. The density rank matrix may be applied to objects for which the interior needs less material or weight, while still maintaining the object strength.

The density rank matrix may be generated from a variety of matrix ordering techniques. Examples of techniques that are used to generate the density rank matrix include blue noise structures, contiguous lattices, etc. For blue noise structures, voxels may be uniformly and homogeneously distributed in space. For contiguous lattices, elements of the density rank matrix may be generated form a line-based skeleton lattice using a line dilation technique. For the line dilation technique, a minimum distance to a skeleton line to each point may be assigned. Each of the points may be rank ordered in the density rank matrix.

The density threshold matrix may be described as a matrix for which the rank values in the density rank matrix are normalized for conversion to threshold values. The density threshold matrix may be the same size as the density rank matrix (i.e., (X, Y, Z)).

The 3D input object may be described as any object that is to be printed and includes a three-dimensional shape. The 3D input object may include discrete-space values that describe the density at each point of the object, from empty space, represented by zero, to solid, represented by a maximum value.

The bistate output object may be described as an object that includes discrete-space where each point is represented by one of two states: zero for empty space, or one for print-a-voxel.

In order to generate the bistate output object, a rendering system may be used. An example of a rendering system may include a 3D printer, and other such devices. For the rendering system, each element of the 3D input object, input(x, y, z), may be compared against a corresponding threshold value in the density threshold matrix, threshold (x, y, z), to print the bistate output object.

In order to generate the density threshold matrix, order, or rank of matrix positions may be determined such that the resulting 3D printed object includes a printed voxel as opposed to empty space as the input density increases. In this regard, a density rank matrix that is used to generate the density threshold matrix may be relatively large. For example, a cubic inch period structure may include R=1200×1200×254=365,760,000 rank elements. As the values of such a density rank matrix are the ranks 0, 1, . . . , (R−1), four bytes are needed to store the elements, which needs approximately 1.46 terabytes of storage. If the input continuous density object has an 8-bit amplitude resolution, a density threshold matrix would need to be scaled to match the input. If the density rank matrix is merely scaled to the input resolution, matrix storage is reduced but subsequent nonlinear transformations would result in the loss of output amplitude resolution due to coarse quantization.

In order to address the aforementioned technical challenges with respect to the manufacture of 3D objects to maintain structural strength and stress accommodation properties, and with respect to quantization loss, given a density rank matrix, the apparatus and method disclosed herein may generate a density threshold matrix that is customized for a particular structure and target printer. The density threshold matrix may provide a variable density structure definition. The density threshold matrix may also provide for implementation of policies for controlling minimum and maximum structure densities, and thus sizes, in a single matrix.

Figure 2:
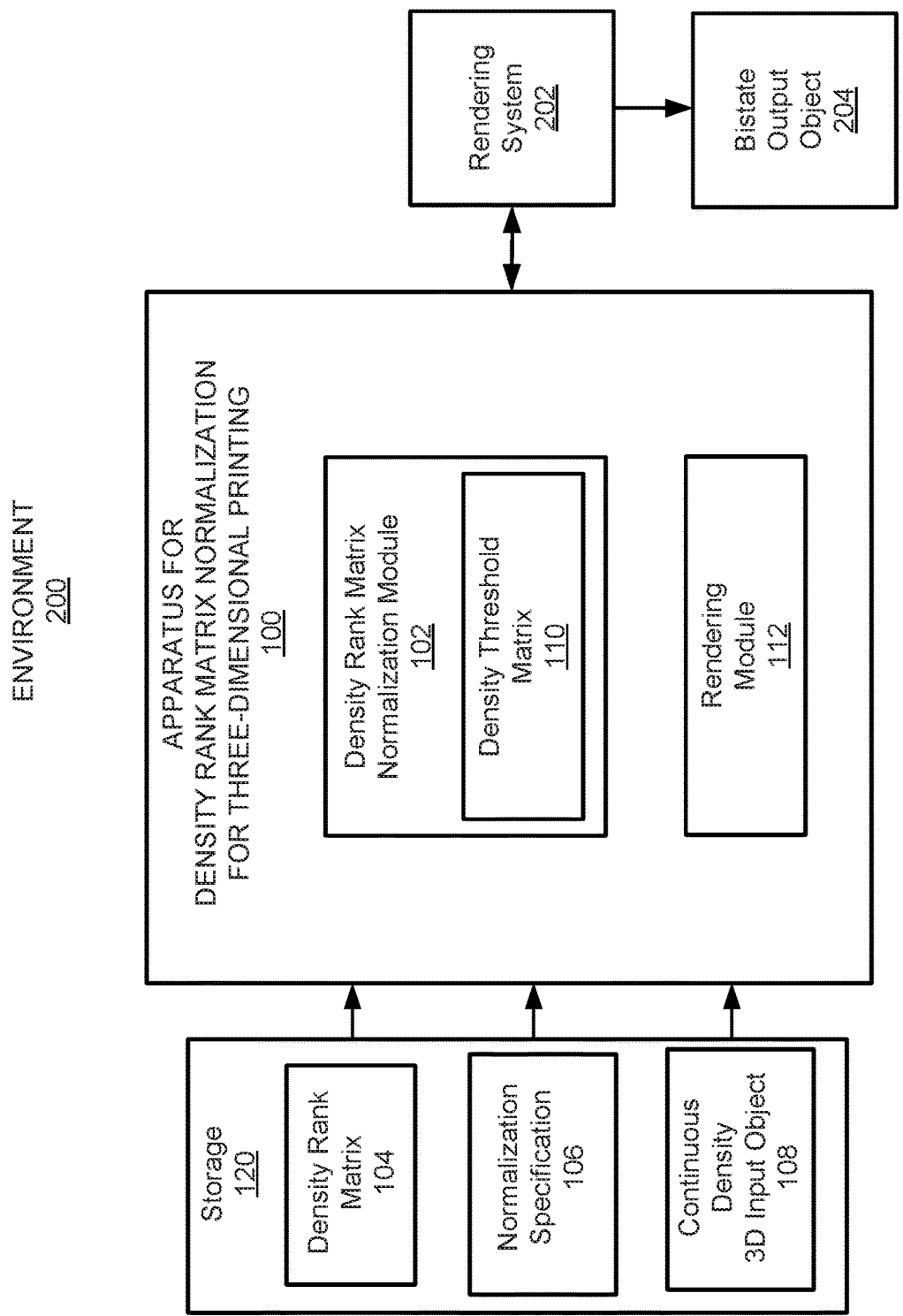
FIG. 2 illustrates an environment including the apparatus 100, according to an example of the present disclosure.
Figure 3:
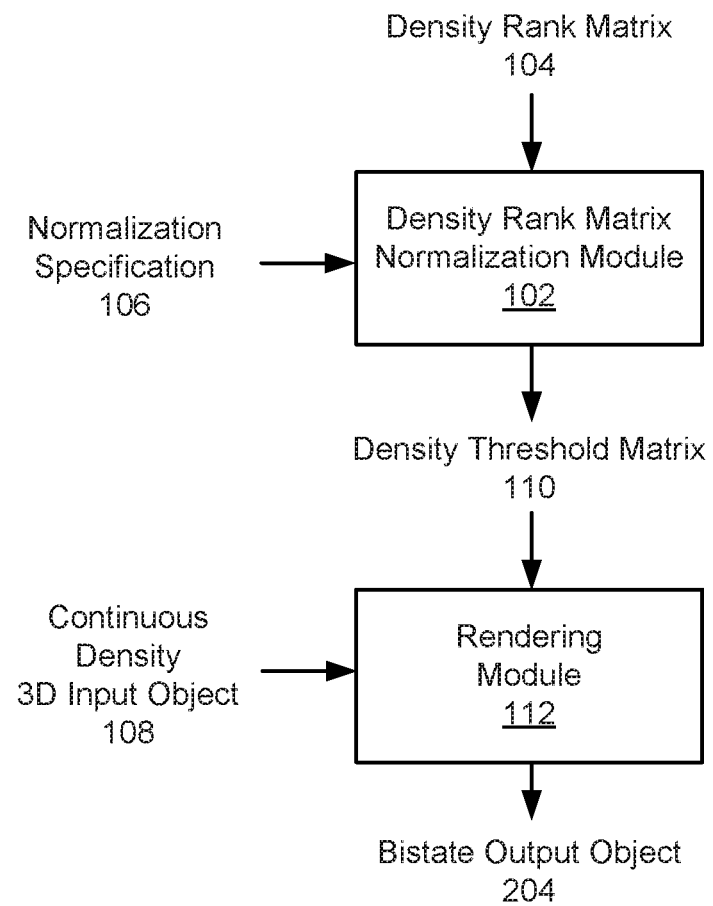
FIG. 3 illustrates a high level overview of density rank matrix generation, normalization, and rendering for the apparatus of FIG. 1, according to an example of the present disclosure.

FIG. 1 illustrates an architecture of an apparatus for density rank matrix normalization for three-dimensional printing (hereinafter also referred to as "apparatus 100"), according to an example of the present disclosure. FIG. 2 illustrates an environment 200 for the apparatus 100, according to an example of the present disclosure.

Referring to FIG. 1, the apparatus 100 is depicted as including a density rank matrix normalization module 102 to receive a density rank matrix 104, normalization specification 106, and information with respect to a 3D input object 108 to generate a density threshold matrix 110. The operations disclosed herein with respect to the density rank matrix normalization module 102 may be performed by a processor (e.g., the processor 2002 of FIG. 20). The density rank matrix 104, the normalization specification 106, and the information with respect to the 3D input object 108 may be stored in and retrieved from a storage 120.

A rendering module 112 may compare each element of the 3D input object 108, input(x, y, z), against a corresponding threshold value in the density threshold matrix 110, threshold(x, y, z), at each location as follows:

if Input$(x,y,z)$>Threshold$(x',y',z')$ then Output$(x,y,z)$=1(i.e., printer voxel)

else Output$(x,y,z)$=0(i.e., empty space)

where x'=x mod X; y'=y mod Y; and z'=z mod Z. The "mod" may represent the modulo operation. The operations disclosed herein with respect to the rendering module 112 may be performed by a processor (e.g., the processor 2002 of FIG. 20).

In some examples, the modules and other elements of the apparatus 100 may be machine readable instructions stored on a non-transitory computer readable medium. In this regard, the apparatus 100 may include or be a non-transitory computer readable medium. In some examples, the modules and other elements of the apparatus 100 may be hardware or a combination of machine readable instructions and hardware.

Referring to FIG. 2, the output of the rendering module 116 (i.e., Output(x, y, z)=1 (i.e., printer voxel), or Output(x, y, z)=0 (i.e., empty space)) may be used by a rendering system 202 to generate a bistate output object 204.

Determination of the density threshold matrix 110 is described in further detail with reference to FIGS. 1, and 3-16.

Figure 4:
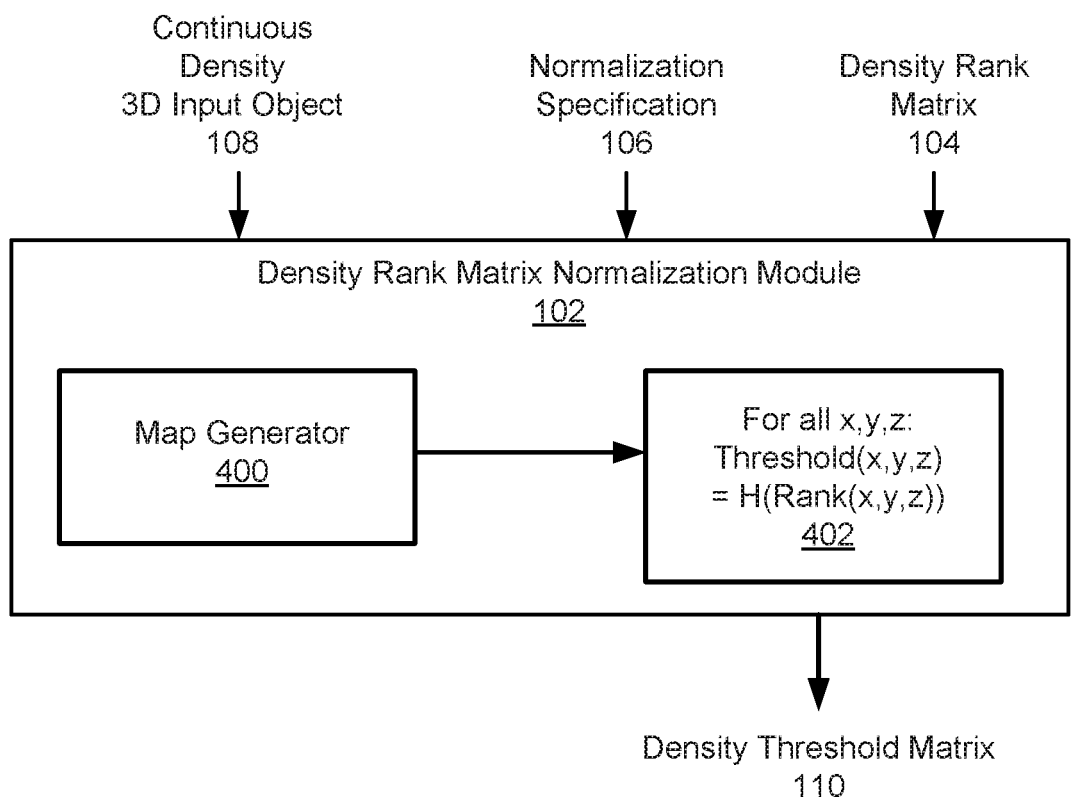
FIG. 4 illustrates details of a density threshold matrix generator of the apparatus of FIG. 1, according to an example of the present disclosure.

In order to determine the density threshold matrix 110, referring to FIG. 4, the map generator 400 may output a function H(r) that converts, as shown at block 402, a rank value of the density rank matrix 104 to a threshold value. In this regard, a normalization specification 106 may include an indication to convert, as shown at block 402, a rank value of the density rank matrix 104 to a threshold value according to the function H(r). The normalization specification 106 may further include minimum and maximum structure sizes as specified by minimum and maximum nonzero thresholds as disclosed herein. For conversion of a rank value of the density rank matrix 104 to a threshold value according to the function H(r), for H(r), r may represent a rank value of the density rank matrix 104. The function H(r) may be used to map all of the rank values in the density rank matrix 104 to values in the density threshold matrix 110 for all (x, y, z) addresses from (0, 0, 0) to (X−1, Y−1, Z−1).

Quantization may be used to convert a relatively large number of rank values to the smaller number of thresholds. For example, a cubic inch density rank matrix 104 may include 1200×1200×254=365,760,000 ranks, but the continuous density 3D input object 108 may include T=256 levels, for a more than a million to one mapping. For example, consider pre-truncating the ranks to 3 bits, or T=8 levels. In this case, all 1200×1200×254 matrix elements of the density rank matrix 104 would each be one of 8 values.

Figure 5:
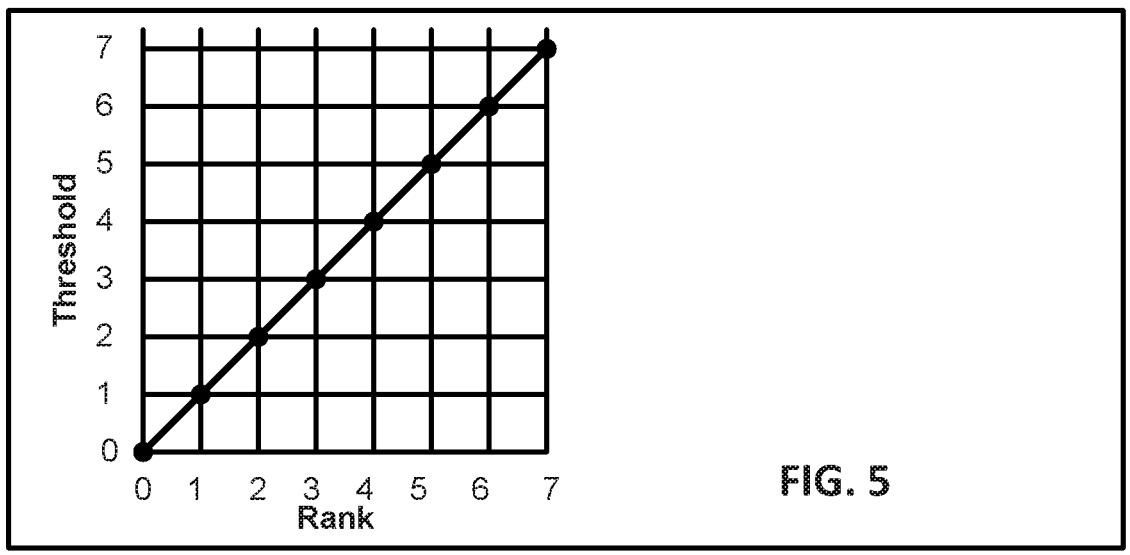
FIG. 5 illustrates mapping of rank to threshold for an identity transformation, according to an example of the present disclosure.

Referring to FIG. 5 which illustrates mapping of rank to threshold for an identity transformation, such a pre-truncating would be acceptable if the mapping includes the identity function as shown in FIG. 5. For the identity function, the rank and threshold may identically correspond to each other.

Figure 6:
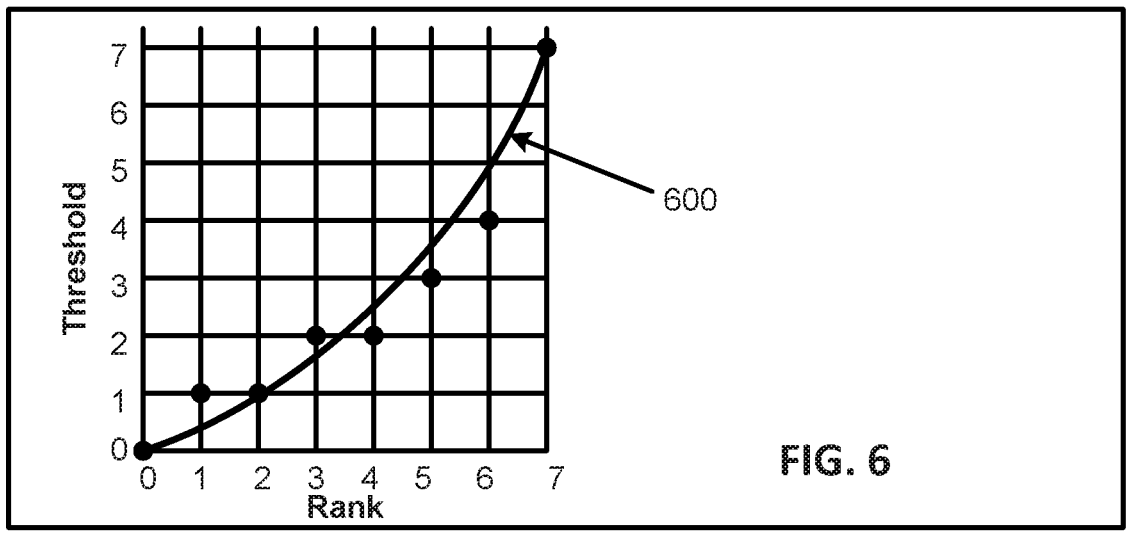
FIG. 6 illustrates mapping of rank to threshold for a non-uniform transformation, according to an example of the present disclosure.

However, referring to FIG. 6 which illustrates mapping of rank to threshold for a non-uniform transformation, a non-uniform gain mapping results in a loss of amplitude resolution, where the curve at 600 represents the desired mapping. The curve at 600 may be used to account for nonlinear gain in structure size. In this case, approximately 25% of the possible output levels may be lost because of the pre-quantization.

Figure 7:
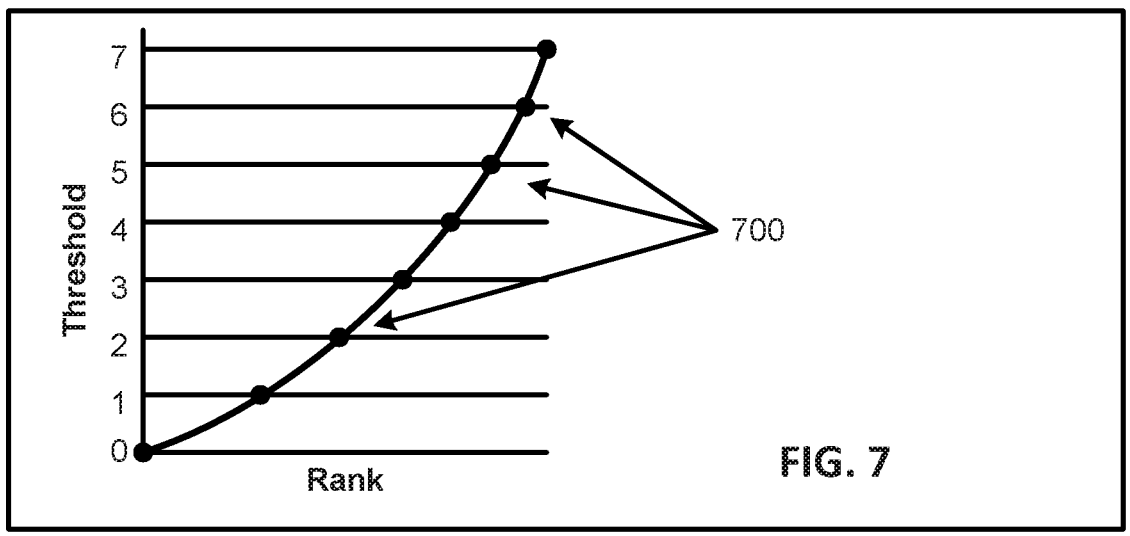
FIG. 7 illustrates many-to-one mapping of rank to threshold for an example transformation, according to an example of the present disclosure.

Another option for mapping of rank to threshold includes retaining the full range of rank values, and segmenting ranges of ranks for conversion to one of the eight output threshold values according to the desired mapping function. As shown in FIG. 7 which illustrates many-to-one mapping of rank to threshold for an example transformation, the points at 700 may represent the values to which ranges of ranks are mapped. The use of the many-to-one mapping may preserve the intended function to a greater degree, without loss of output levels.

Figure 8A:
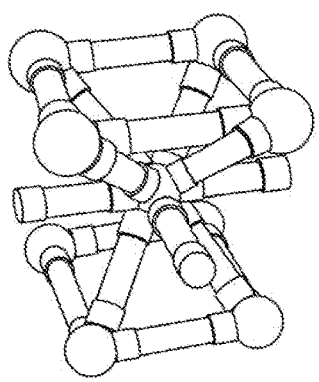
FIG. 8A illustrates a tetrahedral-octahedral lattice.
Figure 8B:
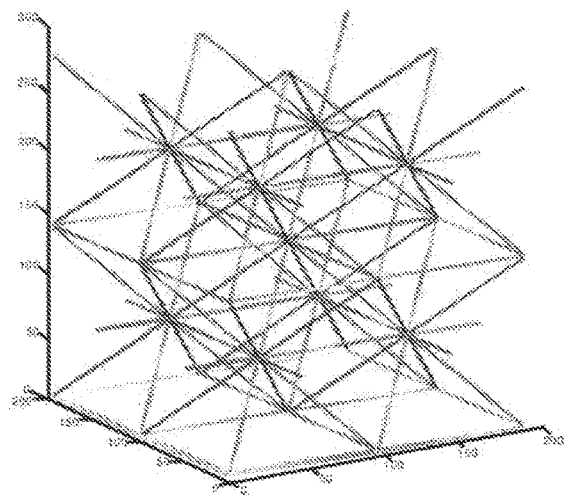
FIGS. 8B-8D illustrate 2×2×2 period output for different low density values, according to an example of the present disclosure.
Figure 8C:
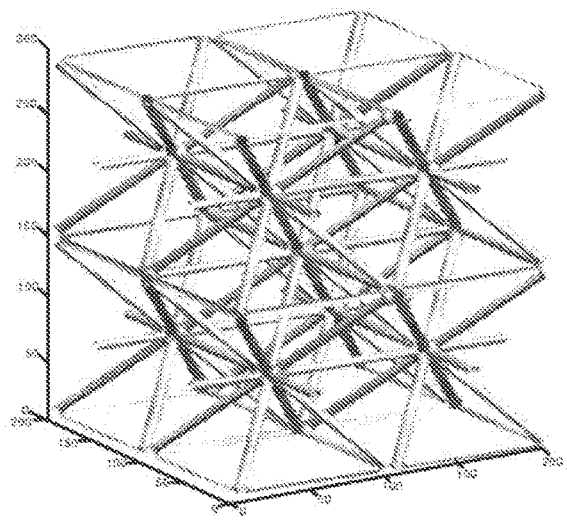
Figure 8D:
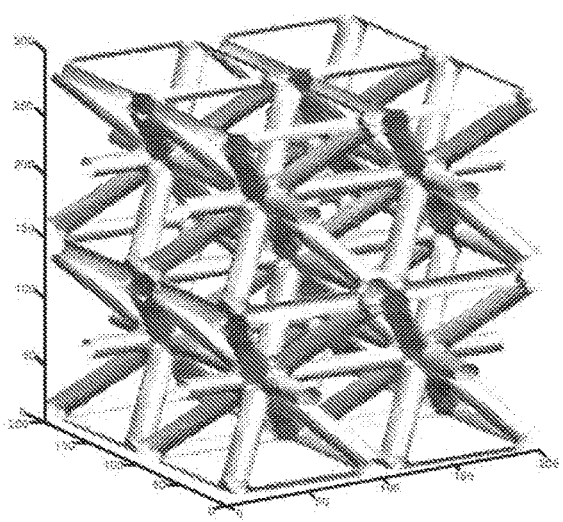

In addition to the accommodating of a gain-related curve, the map generator 400 may also address low and high ends of the density range. By way of example, if a density rank matrix that defines a tetrahedral-octahedral lattice as shown in FIG. 8A is used with a linear normalization, low density samples are displayed in FIGS. 8B-8D for 0.5%, 5%, and 10% density, respectively. As illustrated in FIG. 8A, the tetrahedral-octahedral lattice may be described as a lattice that includes tetrahedral shapes in the interior thereof. Depending on the material used and the size of the lattice period, there may be some density below which a printed object will be too fragile. In this case, it may be desirable to force input values below some minimum density to be mapped to empty space (i.e., no voxels), or some predetermined higher density.

Figure 9A:
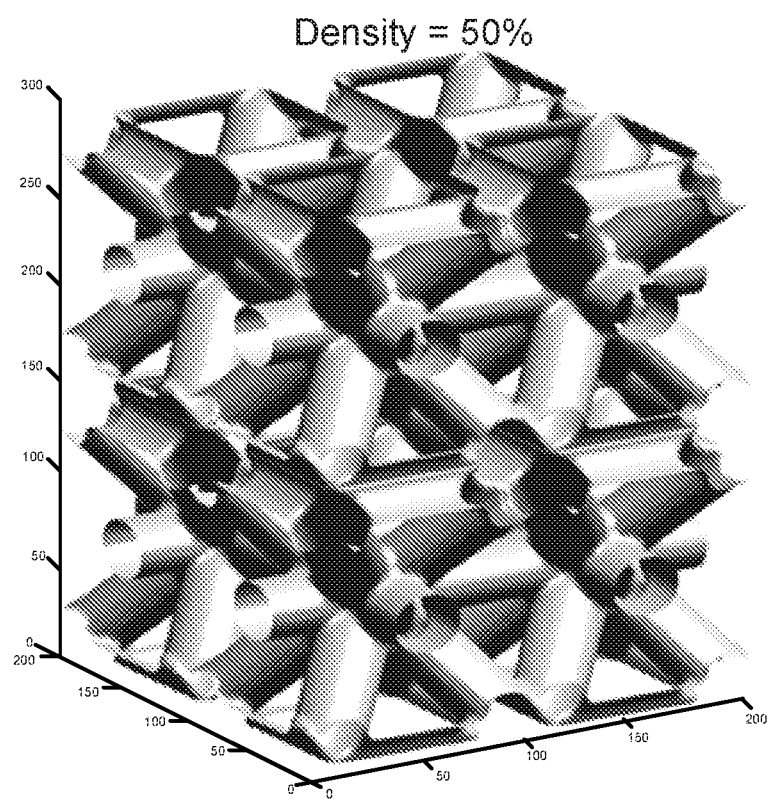
FIGS. 9A-9B illustrate 2×2×2 period output for different mid to high density values, according to an example of the present disclosure.
Figure 9B:
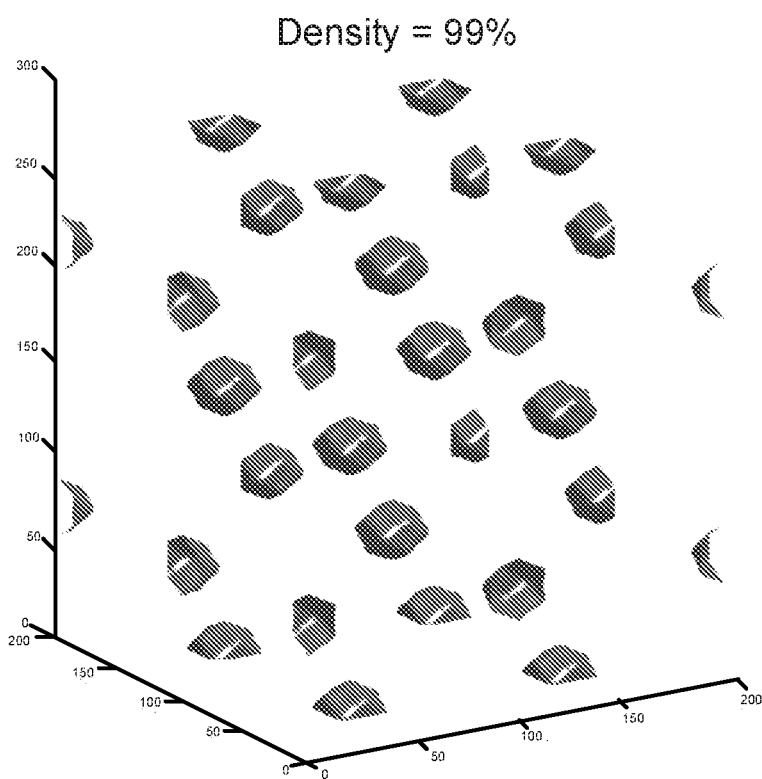

At the high end of the density range, certain adjustments may also be needed. In FIGS. 9A and 9B, the tetrahedral-octahedral lattice is shown rendered at 50% and 99%, respectively. In the case of the 99% rendering for FIG. 9B, the structure predominately fills all space with the exception of some residual gaps that are illustrated in FIG. 9B. Somewhere between 50% and 99%, such gaps become closed, thus prohibiting the removal of unused material used in the manufacturing process. In this regard, it may be desirable to set input values above a maximum density to be mapped to 100% solid, or to a predetermined lower density.

Figure 10:
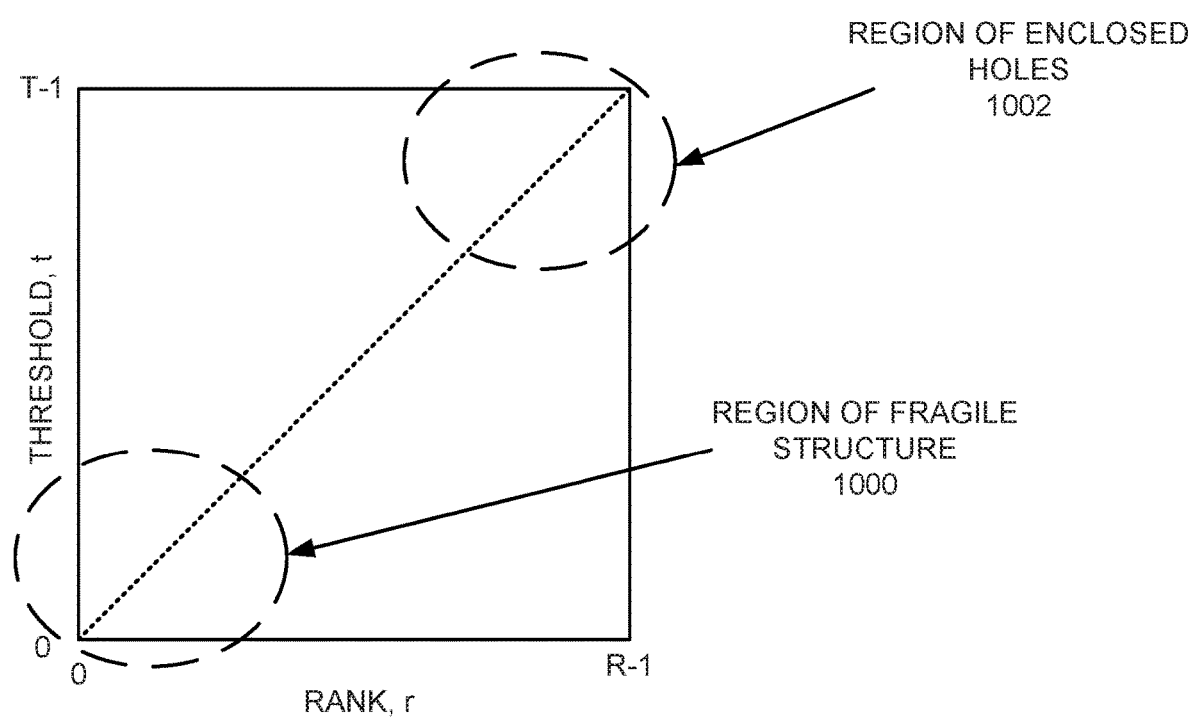
FIG. 10 illustrates density regions that are to be addressed, according to an example of the present disclosure.

FIG. 10 illustrates a graph of the rank to threshold mapping with these low and high end of the ranges circled indicating the potential density areas that are to be addressed. The low end of the range may be designated as a region of fragile structure at 1000, and the high end of the range may be designated as a region of enclosed holes at 1102. The minimum nonzero threshold allowed may be designated as $t_1$, and the maximum non-solid threshold allowed may be designated as $t_2$.

Figure 11:
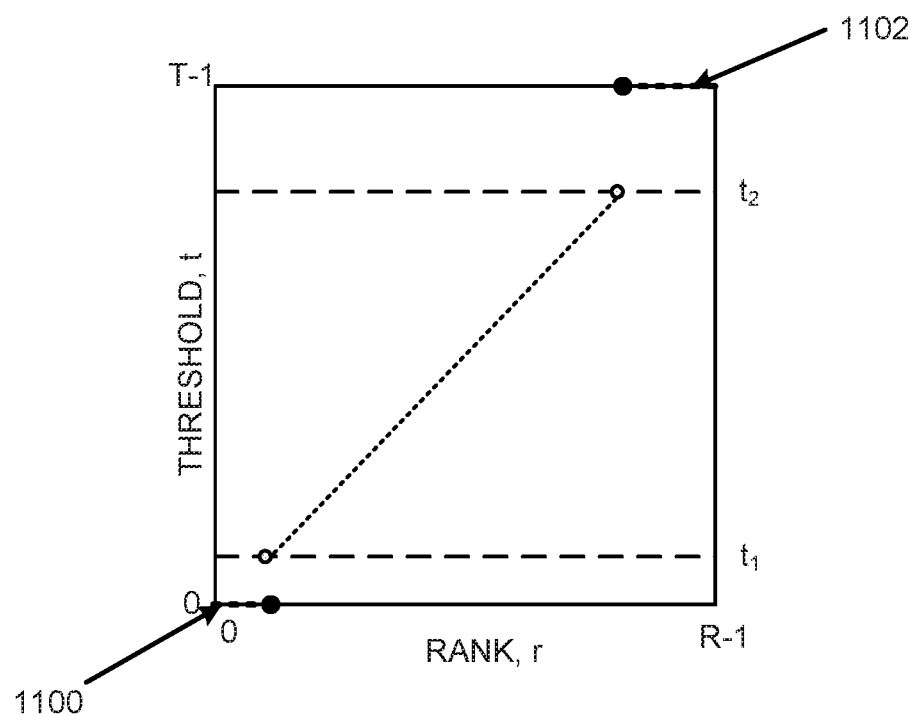
FIG. 11 illustrates clipping a rank-threshold transformation, according to an example of the present disclosure.

In order to enforce these minimum and maximum non-solid threshold limits in the mapping, a first technique may be described as a clipping technique. Referring to FIG. 11 which illustrates clipping the rank-threshold transformation, all ranks, r, which would have mapped to values below $t_1$ are set be 0, or empty space as illustrated at 1100. Further, all ranks which would have mapped to values above $t_2$ are set to the maximum threshold, T−1, as illustrated at 1102, which corresponds to a solid output.

Figure 12:
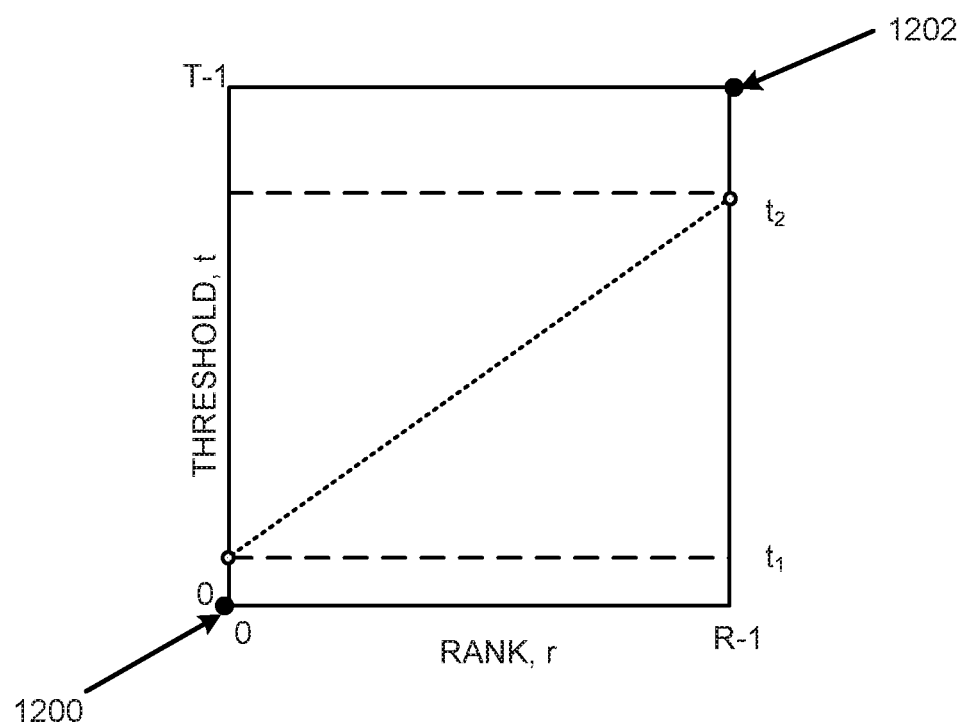
FIG. 12 illustrates stretching the rank-threshold transformation, according to an example of the present disclosure.

In order to enforce these minimum and maximum non-solid threshold limits in the mapping, a second technique may be described as a stretching technique. Referring to FIG. 12 which illustrates stretching the rank-threshold transformation, the original curve is stretched as indicated. The "empty space" rank r=0 is mapped to t=0 as illustrated at 1200, and the solid rank r=(R−1) is mapped to the maximum threshold T−1 as illustrated at 1202. All other rank values are mapped between $t_1$ and $t_2$.

Figure 13:
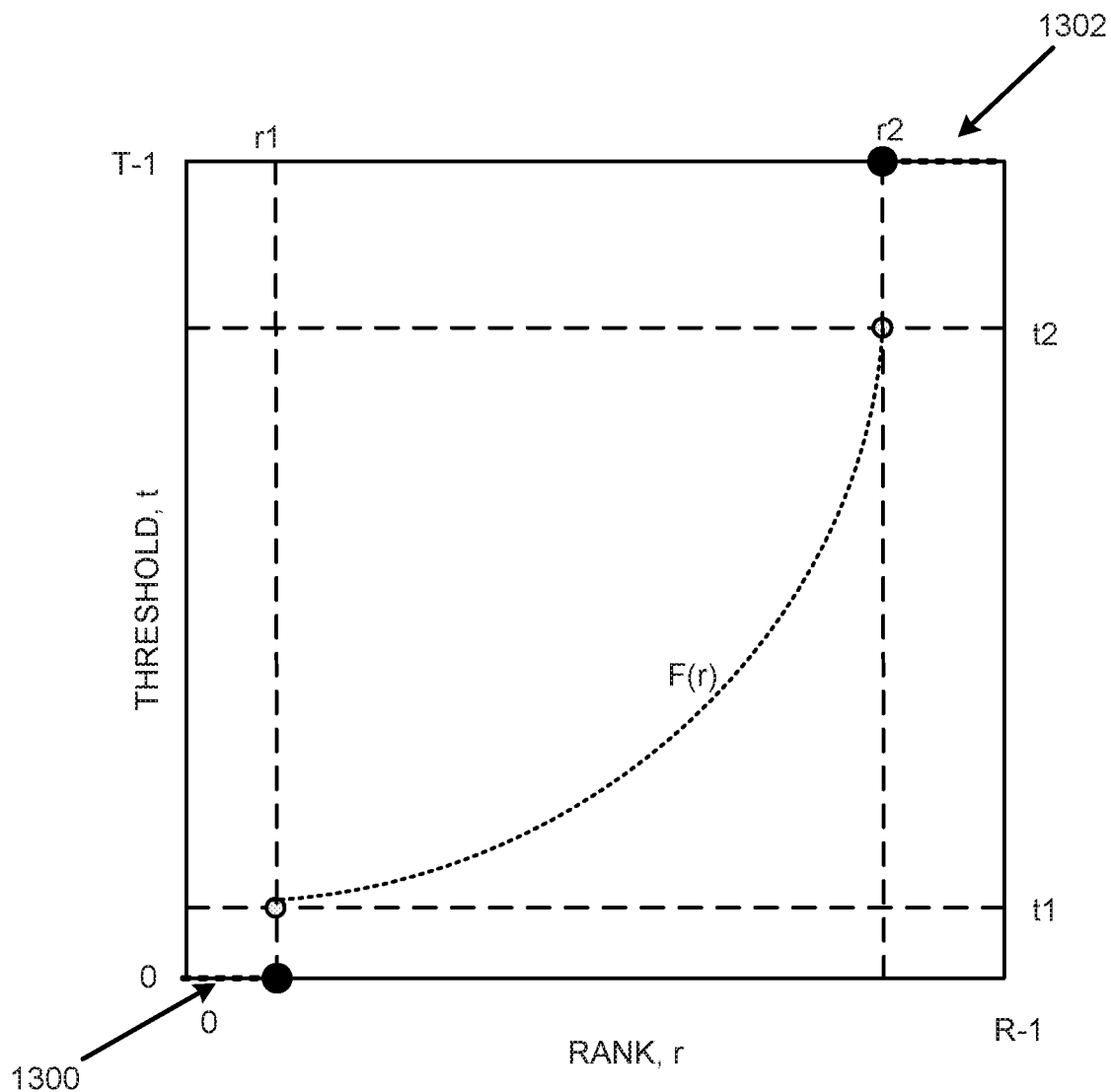
FIG. 13 illustrates a general rank-threshold transformation, according to an example of the present disclosure.

FIG. 13 illustrates a general rank-threshold transformation, according to an example of the present disclosure. Referring to FIG. 13, along with the threshold limits $t_1$ and $t_2$, the length of rank clipping regions may be specified as $r_1$ and $r_2$ as illustrated, respectively at 1300 and 1302. The rank-threshold mapping may be specified as follows:

$$H(r) = \begin{cases} 0 & \text{for } r \leq r_1 \\ f(r) & r_1 < r < r_2 \\ T-1 & r \geq r_2 \end{cases}$$

If a function g(r) is defined for the entire range from (0,0) to ((R−1), (T−1)), then the compressed version may be specified as follows:

$$f(r)=(t_2-t_1)g((r-r_1)/(r_2-r_1))+t_1$$

Figure 14:
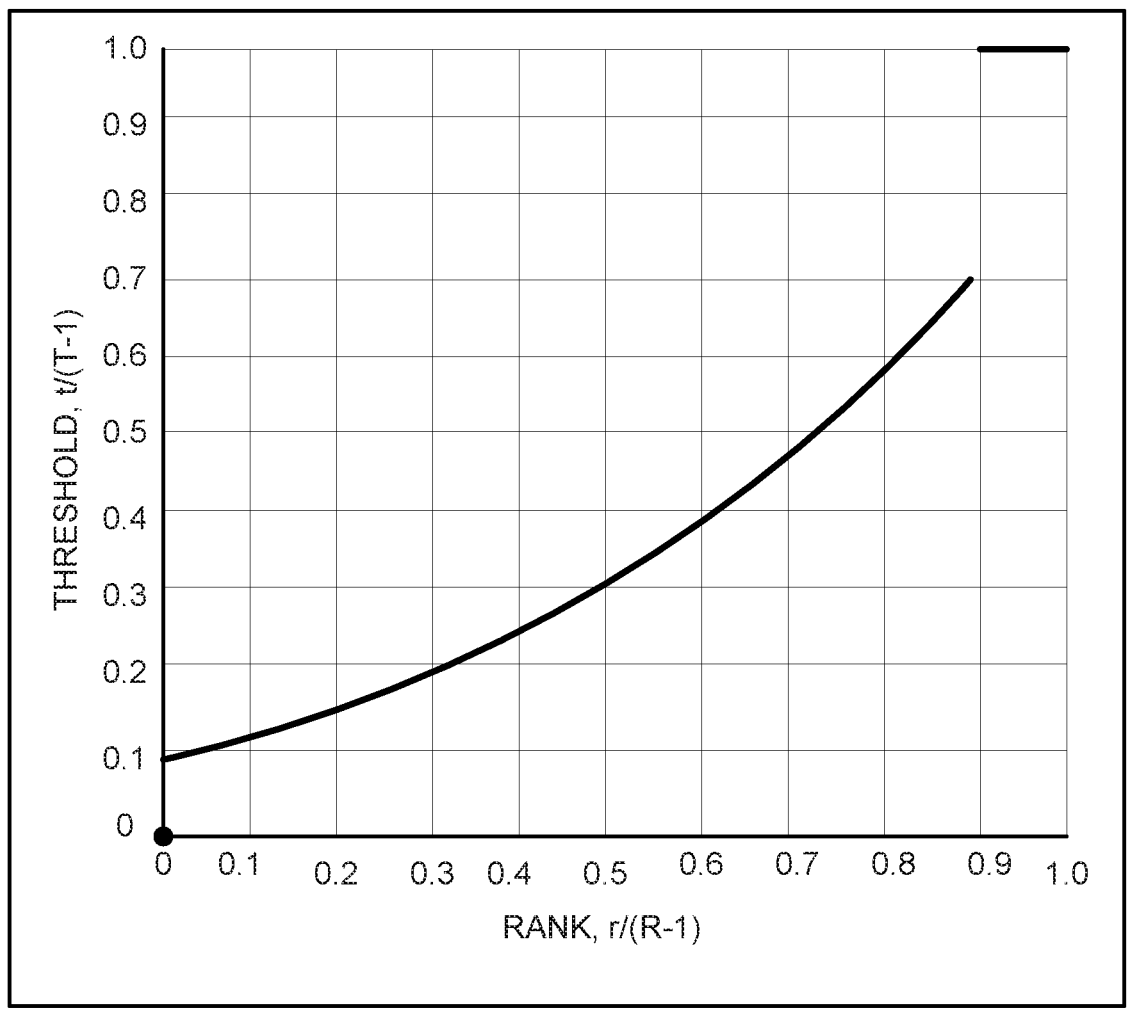
FIG. 14 illustrates an example rank-threshold transformation, according to an example of the present disclosure.
Figure 15:
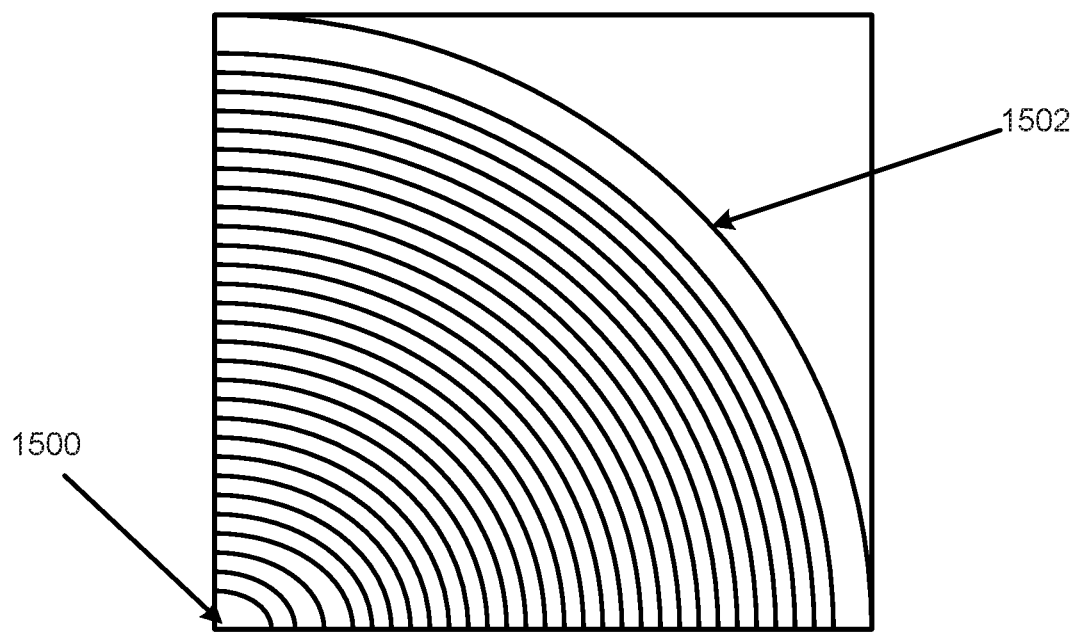
FIG. 15 illustrates a radial cross section of a density map of a sphere, according to an example of the present disclosure.
Figure 16:
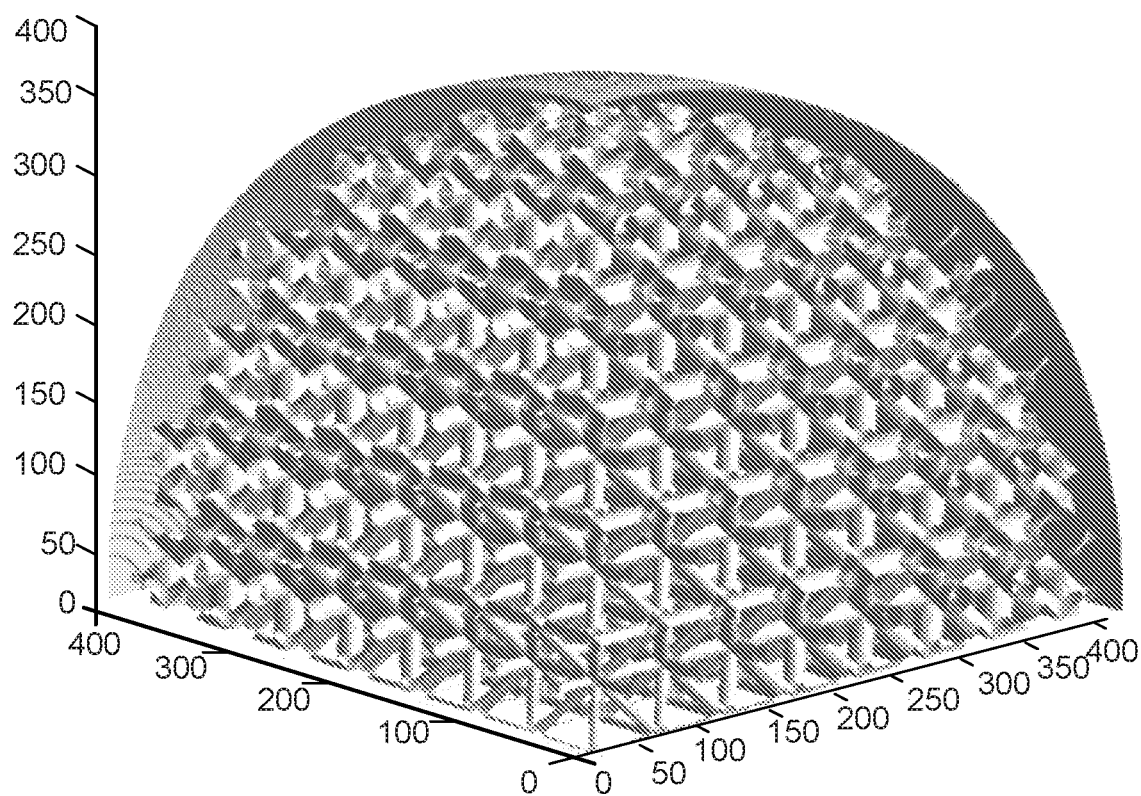
FIG. 16 illustrates one octant of an output object of a variable density sphere input, according to an example of the present disclosure.

FIG. 14 illustrates an example rank-threshold transformation, according to an example of the present disclosure. Referring to FIG. 14, for the mapping, $g(r)=(r/(R-1))^\gamma$, where γ is an exponent that is used for describing tone scale transformation, for example, γ=1.7. This mapping is used to normalize the density rank matrix 104 for a tetrahedral-octahedral lattice to generate the density threshold matrix 110. As illustrated in FIG. 15, the 3D input object 108 may include a sphere that uniformly increases in density from 0 at the center at location 1500, to solid at the surface with a density value of 1 at location 1502. A radial cross section of part of the input object is depicted in FIG. 15, with bands representing changes in density. The mapping forces the minimum density to be 10%, and avoids structures with closed holes. The resulting rendering is illustrated for one octant of the sphere in FIG. 16.

The nature of the rank-threshold mapping may depend on the nature of the density rank matrix structure. For example, the density rank matrix structure may be based on the shape that is to be produced by the density rank matrix. For example, for a tetrahedral-octahedral lattice shape that is to be produced, as disclosed herein, a specified density may yield an output structure that is too thin. Alternatively, for avoiding unfused powder, the density may need to be specified to avoid enclosed voids. In this regard, the apparatus 100 may be tailored to any periodic structure, and to the characteristics of any 3D printer.

Figure 17:
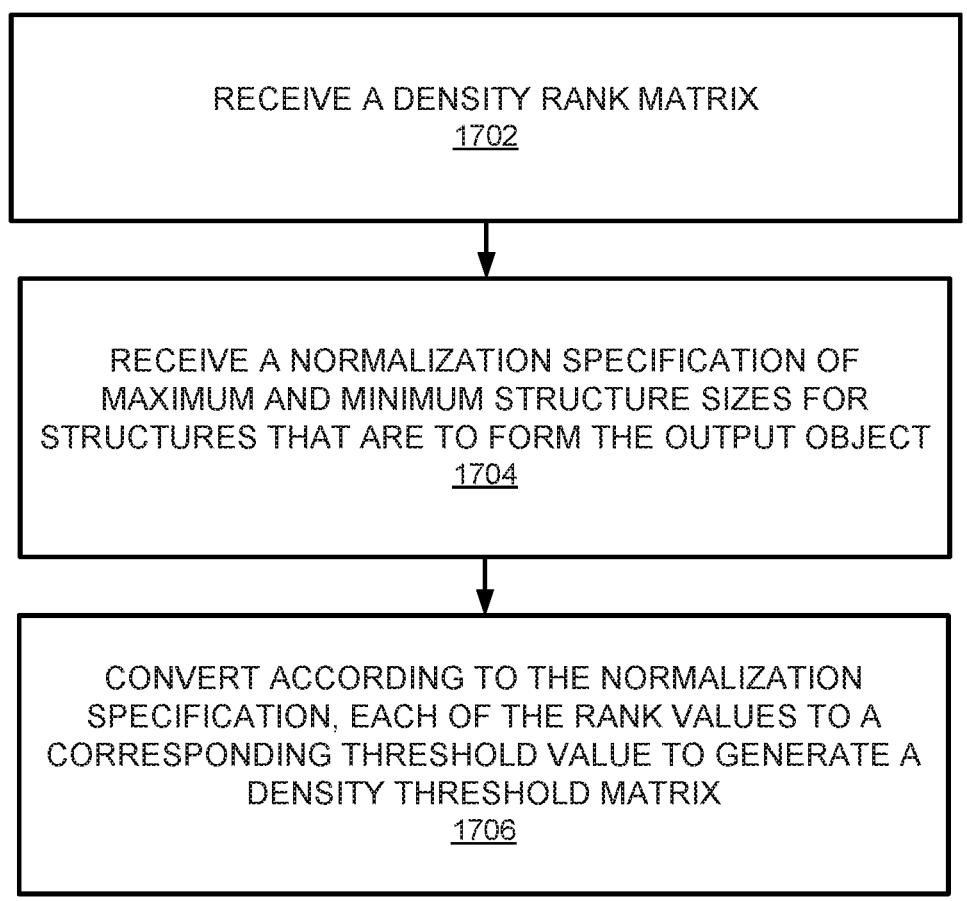
FIG. 17 illustrates a flowchart of a method for density rank matrix normalization for three-dimensional printing, according to an example of the present disclosure.
Figure 18:
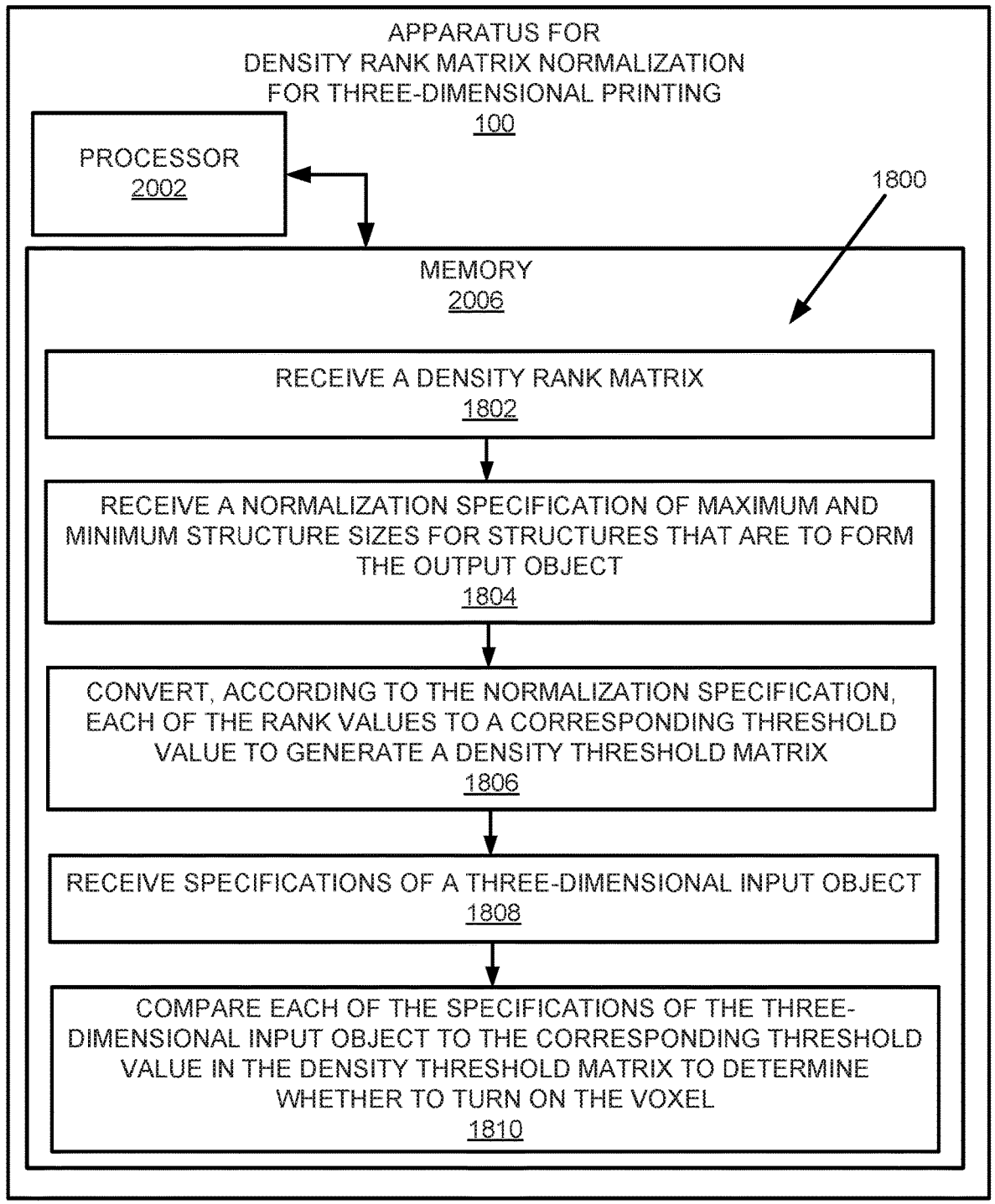
FIG. 18 illustrates another flowchart of a method for density rank matrix normalization for three-dimensional printing, according to an example of the present disclosure.
Figure 19:
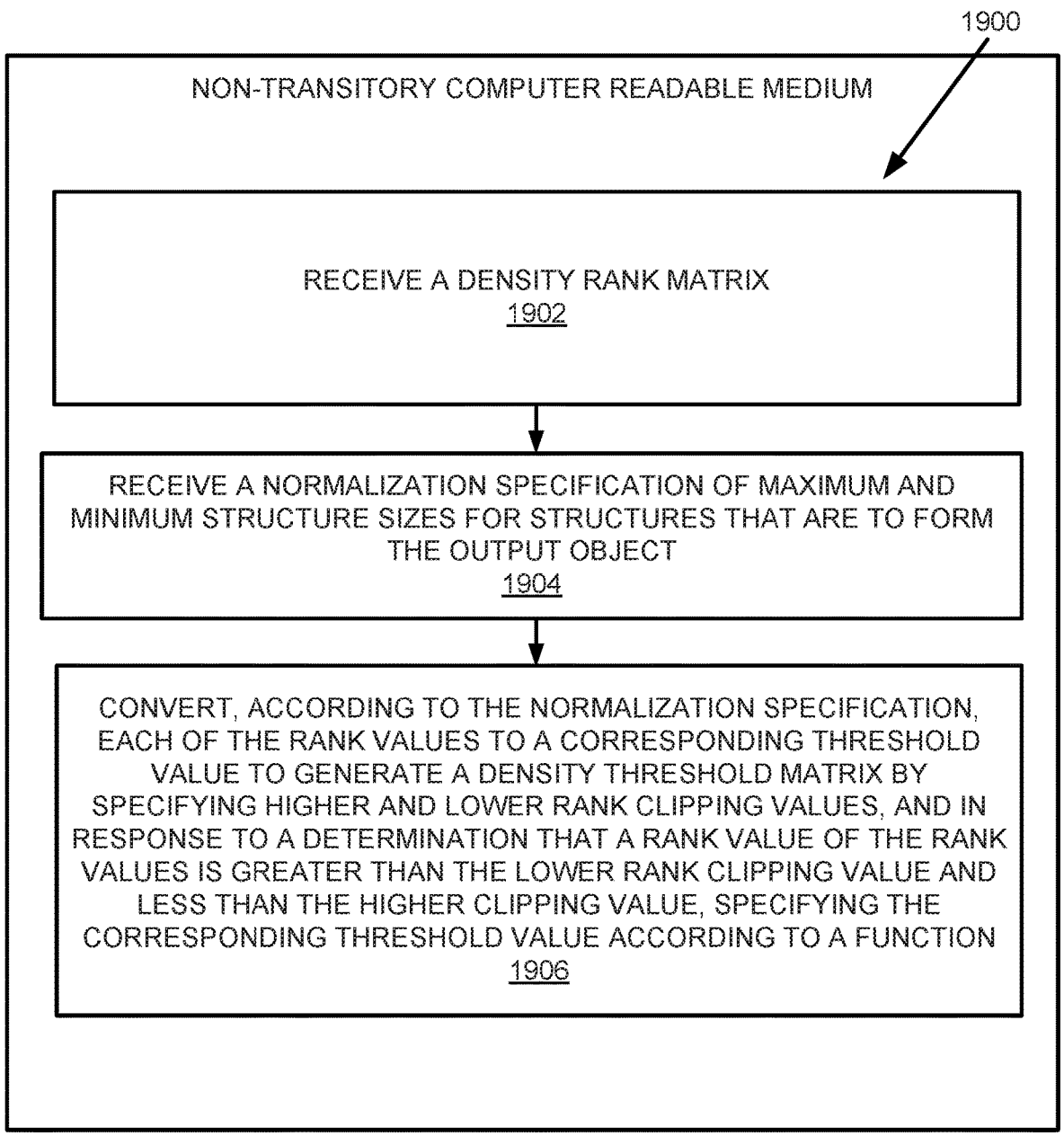
FIG. 19 illustrates a further flowchart of a method for density rank matrix normalization for three-dimensional printing, according to an example of the present disclosure.

FIGS. 17-19 respectively illustrate flowcharts of methods 1700, 1800, and 1900 for density rank matrix normalization for three-dimensional printing, corresponding to the example of the apparatus 100 whose construction is described in detail above. The methods 1700, 1800, and 1900 may be implemented on the apparatus 100 with reference to FIGS. 1-16 by way of example and not limitation. The methods 1700, 1800, and 1900 may be practiced in other apparatus. The steps disclosed herein with respect to the methods 1700, 1800, and 1900 may be performed by a processor (e.g., the processor 2002 of FIG. 20).

Referring to FIGS. 1-17, and particularly FIG. 17, for the method 1700, at block 1702, the method may include receiving the density rank matrix 104. The density rank matrix 104 may include elements that include rank values. The rank values may specify an order by which a voxel is to be turned on to generate the output object 204.

At block 1704, the method 1700 may include receiving the normalization specification 106 of maximum and minimum structure sizes for structures that are to form the output object 204. For example, the normalization specification 106 may further include minimum and maximum structure sizes as specified by minimum and maximum nonzero thresholds $t_1$ and $t_2$, respectively, as disclosed herein.

At block 1706, the method 1700 may include converting, according to the normalization specification 106, each of the rank values to a corresponding threshold value to generate the density threshold matrix 110. For example, as disclosed herein with reference to FIG. 13, the function $H(r)$ may be used to convert, according to the normalization specification 106, each of the rank values to a corresponding threshold value to generate the density threshold matrix 110.

For the method 1700, converting, according to the normalization specification 106, each of the rank values to the corresponding threshold value to generate the density threshold matrix 110 may further include specifying higher and lower rank clipping values (e.g., $r_2$ and $r_1$, respectively, as disclosed herein with respect to FIG. 13). In response to a determination that a rank value of the rank values is less than or equal to the lower rank clipping value, the method 1700 may include specifying the corresponding threshold value for the density threshold matrix 110 as zero (e.g., $H(r)$ for $r \leq r_1$). In response to a determination that the rank value is greater than or equal to the higher rank clipping value, the method 1700 may include specifying the corresponding threshold value for the density threshold matrix 110 as a maximum threshold value (e.g., $H(r)$ for $r \geq r_2$). Further, in response to a determination that the rank value is greater than the lower rank clipping value and less than the higher clipping value, the method 1700 may include specifying the corresponding threshold value according to a function (e.g., $H(r)=f(r)$ for $r_1 < r < r_2$).

For the method 1700, specifying the corresponding threshold value according to the function may further include specifying the corresponding threshold value according to the function of the higher and lower rank clipping values, and higher and lower threshold value limits that correspond to the maximum and minimum structure sizes, respectively.

For the method 1700, the function may include a nonlinear function (e.g., $H(r)=f(r)$ for $r_1 < r < r_2$).

For the method 1700, the density rank matrix 104 may define a tetrahedral-octahedral lattice (e.g., FIGS. 8A-9B).

The method 1700 may further include receiving specifications of the three-dimensional input object 108, and comparing each of the specifications of the three-dimensional input object 108 to the corresponding threshold value in the density threshold matrix 110 to determine whether to turn on the voxel. For example, the rendering module 112 may compare each element of the 3D input object 108, input(x, y, z), against a corresponding threshold value in the density threshold matrix 110, threshold(x, y, z), at each location, to determine whether to turn on the voxel.

For the method 1700, comparing each of the specifications of the three-dimensional input object 108 to the corresponding threshold value in the density threshold matrix 110 to determine whether to turn on the voxel may further include applying a modulo operation to each threshold value in the density threshold matrix 110. Further, a determination may be made as to whether a specification of the three-dimensional input object 108 is greater than a corresponding modulo based threshold value. The corresponding modulo based threshold value may represent a threshold value to which the modulo operation is applied. In response to a determination that the specification of the three-dimensional input object 108 is greater than the corresponding modulo based threshold value, the method 1700 may include indicating that the voxel is to be turned on. In response to a determination that the specification of the three-dimensional input object 108 is less than or equal to the corresponding modulo based threshold value, the method 1700 may include indicating that the voxel is not to be turned on. For example, if Input(x, y, z)>Threshold (x', y', z'), then Output(x, y, z)=1 (i.e., printer voxel), else Output(x, y, z)=0 (i.e., empty space), where x'=x mod X; y'=y mod Y; and z'=z mod Z.

Referring to FIGS. 1-16 and 18, for the method 1800, at block 1802, the method may include receiving the density rank matrix 104. The density rank matrix 104 may include elements that include rank values. The rank values may specify an order by which a voxel is to be turned on to generate an output object.

At block 1804, the method 1800 may include receiving the normalization specification 106 of maximum and minimum structure sizes for structures that are to form the output object. For example, the normalization specification 106 may further include minimum and maximum structure sizes as specified by minimum and maximum nonzero thresholds $t_1$ and $t_2$, respectively, as disclosed herein.

At block 1806, the method 1800 may include converting, according to the normalization specification, each of the rank values to a corresponding threshold value to generate the density threshold matrix 110. For example, as disclosed herein with reference to FIG. 13, the function $H(r)$ may be used to convert, according to the normalization specification 106, each of the rank values to a corresponding threshold value to generate the density threshold matrix 110.

At block 1808, the method 1800 may include receiving specifications of a three-dimensional input object 108.

At block 1810, the method 1800 may include comparing each of the specifications of the three-dimensional input object 108 to the corresponding threshold value in the density threshold matrix 110 to determine whether to turn on the voxel. For example, the rendering module 112 may compare each element of the 3D input object 108, input(x, y, z), against a corresponding threshold value in the density threshold matrix 110, threshold(x, y, z), at each location, to determine whether to turn on the voxel.

Referring to FIGS. 1-16 and 19, for the method 1900, at block 1902, the method may include receiving the density rank matrix 104. The density rank matrix 104 may include elements that include rank values. The rank values may specify an order by which a voxel is to be turned on to generate the output object 204.

At block 1904, the method 1900 may include receiving the normalization specification 106 of maximum and minimum structure sizes for structures that are to form the output object 204. For example, the normalization specification 106 may further include minimum and maximum structure sizes as specified by minimum and maximum nonzero thresholds $t_1$ and $t_2$, respectively, as disclosed herein.

At block 1906, the method 1900 may include converting, according to the normalization specification, each of the rank values to a corresponding threshold value to generate the density threshold matrix 110 by specifying higher and lower rank clipping values (e.g., $r_2$ and $r_1$, respectively, as disclosed herein with respect to FIG. 13). Further, in response to a determination that a rank value of the rank values is greater than the lower rank clipping value and less than the higher clipping value, the method 1900 may include specifying the corresponding threshold value according to a function (e.g., $H(r)=f(r)$ for $r_1<r<r_2$).

Figure 20:
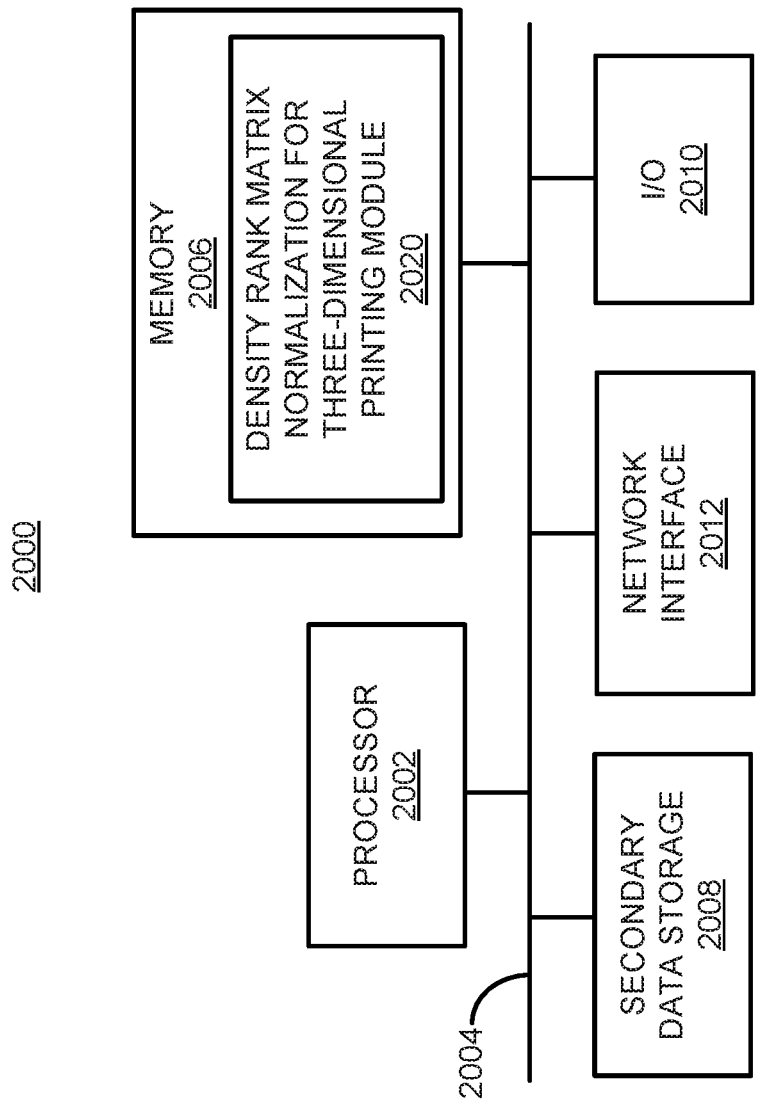
FIG. 20 illustrates a computer system, according to an example of the present disclosure.

FIG. 20 shows a computer system 2000 that may be used with the examples described herein. The computer system 2000 may represent an operational platform that includes components that may be in a server or another computer system. The computer system 2000 may be used as a platform for the apparatus 100. The computer system 2000 may execute, by a processor (e.g., a single or multiple processors) or other hardware processing circuit, the methods, functions and other processes described herein. These methods, functions and other processes may be embodied as machine readable instructions stored on a computer readable medium, which may be non-transitory, such as hardware storage devices (e.g., RAM (random access memory), ROM (read only memory), EPROM (erasable, programmable ROM), EEPROM (electrically erasable, programmable ROM), hard drives, and flash memory).

The computer system 2000 may include the processor 2002 that may implement or execute machine readable instructions performing some or all of the methods, functions and other processes described herein. Commands and data from the processor 2002 may be communicated over a communication bus 2004. The computer system may also include the main memory 2006, such as a random access memory (RAM), where the machine readable instructions and data for the processor 2002 may reside during runtime, and a secondary data storage 2008, which may be non-volatile and stores machine readable instructions and data. The memory and data storage are examples of computer readable mediums. The memory 2006 may include a density rank matrix normalization for 3D printing module 2020 including machine readable instructions residing in the memory 2006 during runtime and executed by the processor 2002. The density rank matrix normalization for 3D printing module 2020 may include the modules of the apparatus 100 shown in FIG. 1.

The computer system 2000 may include an I/O device 2010, such as a keyboard, a mouse, a display, etc. The computer system may include a network interface 2012 for connecting to a network. Other known electronic components may be added or substituted in the computer system.

What has been described and illustrated herein is an example along with some of its variations. The terms, descriptions and figures used herein are set forth by way of illustration and are not meant as limitations. Many variations are possible within the spirit and scope of the subject matter, which is intended to be defined by the following claims—and their equivalents—in which all terms are meant in their broadest reasonable sense unless otherwise indicated.

What is claimed is:

1. A method for density rank matrix normalization for three-dimensional printing, the method comprising:
   receiving a density rank matrix, wherein the density rank matrix includes elements that include rank values, and wherein the rank values specify an order by which a voxel is to be turned on to generate an output object;
   receiving a normalization specification of maximum and minimum structure sizes for structures that are to form the output object; and
   converting, by a processor, according to the normalization specification, each of the rank values to a corresponding threshold value to generate a density threshold matrix by
   specifying higher and lower rank clipping values, and
   in response to a determination that a rank value of the rank values is greater than the lower rank clipping value and less than the higher clipping value, specifying the corresponding threshold value according to a function.

2. The method according to claim 1, wherein converting, according to the normalization specification, each of the rank values to the corresponding threshold value to generate the density threshold matrix further comprises:
   in response to a determination that the rank value is less than or equal to the lower rank clipping value, specifying the corresponding threshold value for the density threshold matrix as zero; and
   in response to a determination that the rank value is greater than or equal to the higher rank clipping value, specifying the corresponding threshold value for the density threshold matrix as a maximum threshold value.

3. The method according to claim 1, wherein specifying the corresponding threshold value according to the function further comprises:
   specifying the corresponding threshold value according to the function of the higher and lower rank clipping values, and higher and lower threshold value limits that correspond to the maximum and minimum structure sizes, respectively.

4. The method according to claim 1, wherein the function is a non-linear function.

5. The method according to claim 1, wherein the density rank matrix defines a tetrahedral-octahedral lattice.

6. The method according to claim 1, further comprising:
   receiving specifications of a three-dimensional input object; and
   comparing each of the specifications of the three-dimensional input object to the corresponding threshold value in the density threshold matrix to determine whether to turn on the voxel.

7. The method according to claim 6, wherein comparing each of the specifications of the three-dimensional input object to the corresponding threshold value in the density threshold matrix to determine whether to turn on the voxel further comprises:
   applying a modulo operation to each threshold value in the density threshold matrix;
   determining whether a specification of the three-dimensional input object is greater than a corresponding modulo based threshold value, wherein the corresponding modulo based threshold value represents a threshold value to which the modulo operation is applied;
   in response to a determination that the specification of the three-dimensional input object is greater than the corresponding modulo based threshold value, indicating that the voxel is to be turned on; and
   in response to a determination that the specification of the three-dimensional input object is less than or equal to the corresponding modulo based threshold value, indicating that the voxel is not to be turned on.

8. An apparatus for density rank matrix normalization for three-dimensional printing comprising:
- a processor; and
- a memory storing machine readable instructions that when executed by the processor cause the processor to:
  - receive a density rank matrix, wherein the density rank matrix includes elements that include rank values, and wherein the rank values specify an order by which a voxel is to be turned on to generate an output object;
  - receive a normalization specification of maximum and minimum structure sizes for structures that are to form the output object;
  - convert, according to the normalization specification, each of the rank values to a corresponding threshold value to generate a density threshold matrix by specifying higher and lower rank clipping values, and in response to a determination that a rank value of the rank values is greater than the lower rank clipping value and less than the higher clipping value, specifying the corresponding threshold value according to a function:
  - receive specifications of a three-dimensional input object; and
  - compare each of the specifications of the three-dimensional input object to the corresponding threshold value in the density threshold matrix to determine whether to turn on the voxel.

9. The apparatus for density rank matrix normalization for three-dimensional printing according to claim 8, wherein the machine readable instructions that cause the processor to compare each of the specifications of the three-dimensional input object to the corresponding threshold value in the density threshold matrix to determine whether to turn on the voxel further comprise machine readable instructions that when executed by the processor further cause the processor to:
- apply a modulo operation to each threshold value in the density threshold matrix;
- determine whether a specification of the three-dimensional input object is greater than a corresponding modulo based threshold value, wherein the corresponding modulo based threshold value represents a threshold value to which the modulo operation is applied;
- in response to a determination that the specification of the three-dimensional input object is greater than the corresponding modulo based threshold value, indicate that the voxel is to be turned on; and
- in response to a determination that the specification of the three-dimensional input object is less than or equal to the corresponding modulo based threshold value, indicate that the voxel is not to be turned on.

10. The apparatus for density rank matrix normalization for three-dimensional printing according to claim 8, wherein the machine readable instructions that cause the processor to convert, according to the normalization specification, each of the rank values to the corresponding threshold value to generate the density threshold matrix further comprise machine readable instructions that when executed by the processor further cause the processor to:
- in response to a determination that the rank value is less than or equal to the lower rank clipping value, specify the corresponding threshold value for the density threshold matrix as zero; and
- in response to a determination that the rank value is greater than or equal to the higher rank clipping value, specify the corresponding threshold value for the density threshold matrix as a maximum threshold value.

11. The apparatus for density rank matrix normalization for three-dimensional printing according to claim 8, wherein the machine readable instructions that cause the processor to specify the corresponding threshold value according to the function further comprise machine readable instructions that when executed by the processor further cause the processor to:
- specify the corresponding threshold value according to the function of the higher and lower rank clipping values, and higher and lower threshold value limits that correspond to the maximum and minimum structure sizes, respectively.

12. The apparatus for density rank matrix normalization for three-dimensional printing according to claim 8, wherein the function is a non-linear function.

13. A non-transitory computer readable medium having stored thereon machine readable instructions to provide density rank matrix normalization for three-dimensional printing, the machine readable instructions, when executed, cause a processor to:
- receive a density rank matrix, wherein the density rank matrix includes elements that include rank values, and wherein the rank values specify an order by which a voxel is to be turned on to generate an output object;
- receive a normalization specification of maximum and minimum structure sizes for structures that are to form the output object; and
- convert, according to the normalization specification, each of the rank values to a corresponding threshold value to generate a density threshold matrix by
  - specifying higher and lower rank clipping values, and
  - in response to a determination that a rank value of the rank values is greater than the lower rank clipping value and less than the higher clipping value, specifying the corresponding threshold value according to a function.

14. The non-transitory computer readable medium according to claim 13, wherein the machine readable instructions to convert, according to the normalization specification, each of the rank values to the corresponding threshold value to generate the density threshold matrix, further comprise machine readable instructions to:
- in response to a determination that the rank value is less than or equal to the lower rank clipping value, specifying the corresponding threshold value for the density threshold matrix as zero; and
- in response to a determination that the rank value is greater than or equal to the higher rank clipping value, specifying the corresponding threshold value for the density threshold matrix as a maximum threshold value.

15. The non-transitory computer readable medium according to claim 13, wherein the density rank matrix defines a tetrahedral-octahedral lattice.

* * * * *